United States Patent [19]
Tang et al.

[11] Patent Number: 6,066,357
[45] Date of Patent: May 23, 2000

[54] METHODS OF MAKING A FULL-COLOR ORGANIC LIGHT-EMITTING DISPLAY

[75] Inventors: Ching W. Tang, Rochester; Kee-Chuan Pan, Pittsford, both of N.Y.

[73] Assignee: Eastman Kodak Company, Rochester, N.Y.

[21] Appl. No.: 09/217,729

[22] Filed: Dec. 21, 1998

[51] Int. Cl.[7] .................................................. B05D 5/06
[52] U.S. Cl. .................. 427/66; 427/68; 427/69; 427/164; 427/165; 427/265; 427/266; 427/269
[58] Field of Search ................................. 427/66, 68, 69, 427/165, 164, 269, 265, 266, 389.7, 407.3, 255.19, 255.14

[56] References Cited

U.S. PATENT DOCUMENTS

| | | | |
|---|---|---|---|
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 4,769,292 | 9/1988 | Tang et al. | 428/690 |
| 5,294,869 | 3/1994 | Tang et al. | 313/504 |
| 5,294,870 | 3/1994 | Tang et al. | 313/504 |

*Primary Examiner*—Janyce Bell
*Attorney, Agent, or Firm*—Raymond L. Owens

[57] ABSTRACT

Methods of making a full-color organic light-emitting display are disclosed. The methods include ink-jet printing of fluorescent dopants selected to produce red, green, or blue light emission from designated subpixels of the display. The dopants are printed sequentially from ink-jet printing compositions which permit printing of dopant layers over a light-emitting layer containing a host material selected to provide host light emission in a blue spectral region. The dopants are diffused from the dopant layer into the light-emitting layer by exposing the light-emitting layer and the dopant layers to vapor of a fluid or fluid mixture. When an ink-jet printing composition is formulated with a printing fluid having fluid vapors which promote dopant diffusion, the steps of ink-jet printing and diffusing of dopants can be combined to form a selectively doped light-emitting layer.

47 Claims, 9 Drawing Sheets

METHODS OF MAKING A FULL-COLOR ORGANIC LIGHT-EMITTING DISPLAY

CROSS REFERENCE TO RELATED APPLICATIONS

The present invention is related to U.S. patent application Ser. No. 09/192,066 filed Nov. 13, 1998, entitled "Method of Making an Organic Light-Emitting Device" to Tang et al., assigned to the assignee of the present invention, which discloses methods of providing in a light-emitting layer of an organic light-emitting device a dopant capable of modifying light emitted from the device. The disclosure of this related application is incorporated herein by reference.

FIELD OF THE INVENTION

The present invention relates to method of making full-color organic light-emitting displays. Specifically, the invention is directed to methods of forming in a light-emitting host layer a pattern of dopants with each dopant selected and patterned to provide colored light emission from corresponding subpixels of an array of pixels of an organic light-emitting display.

BACKGROUND OF THE INVENTION

Organic light-emitting devices, also referred to as organic electroluminescent (EL) devices or as organic internal junction light-emitting devices, contain spaced electrodes separated by an organic light-emitting structure (also referred to as an organic EL medium) which emits electromagnetic radiation, typically light, in response to the application of an electrical potential difference across the electrodes. At least one of the electrodes is light transmissive, and the organic light-emitting structure can have from 2–4 overlying organic thin film layers which provide for hole injection and transport from an anode, and for electron injection and transport from a cathode, respectively, with light emission resulting from electron-hole recombination at an internal junction formed at an interface between the hole-transporting and the electron-transporting thin films. As employed herein, the term "thin film" refers to layer thicknesses of less than 5 micrometer with layer thickness of less than about 2 micrometer being typical. Examples of organic light-emitting devices containing organic light-emitting structures and cathode constructions formed by thin film deposition techniques are provided by Tang U.S. Pat. No. 4,356,429; VanSlyke et al., U.S. Pat. Nos. 4,539,507 and 4,720,432; and Tang et al., U.S. Pat. No. 4,769,292.

During operation of an organic light-emitting device, the spectral distribution of emitted light (measured in terms of spectral radiance) is related to the electroluminescent properties of the organic thin films used in the device construction. For example, if an organic light-emitting structure includes a light-emitting layer which contains a light-emitting host material, the emitted light will be reflective of, or be dominated by, the host light emission from the host material.

Tang et al., in the above-cited U.S. Pat. No. 4,769,292, recognized that advantageous performance features of an organic light-emitting device could be obtained if the device included a luminescent zone (or light-emitting layer) of less than 1 micrometer in thickness and comprised of an organic host material capable of sustaining hole-electron recombination, and a fluorescent material capable of emitting light in response to energy released by hole-electron recombination. The introduction of a fluorescent material into a layer of a light-emitting host material will modify the host light emission, and can improve the operational stability of an organic light-emitting device. In analogy to terminology used in the semiconductor industry, fluorescent materials dispersed uniformly at relatively low concentration in light-emitting organic host materials are called "dopants."

Such organic light-emitting devices which emit light in response to an applied voltage, and cease to emit light when the applied voltage is removed, are constructed with an anode and a cathode which are each unitary elements whose light emission can be turned on or turned off, but which lack an image display capability when used alone.

When an organic EL device is to receive an image display capability, the device is constructed with a plurality of light-emitting pixels which are generally arranged as an array in intersecting columns and rows. This is achieved by patterning the anode and cathode of the former unitary elements into a plurality of individually electrically addressable anode and cathode electrodes which are orthogonally oriented with respect to each other, with the organic EL medium disposed between the plurality of anodes and the plurality of intersecting cathodes. Such an organic EL display, also referred to variously as an image display or an image display panel, has an organic EL medium which uniformly (i.e., unpatterned) extends laterally between the respective sets of anode and cathode electrodes, and is capable of monochrome image display, that is a display providing emission of light having a single hue.

In constructing a full-color organic light-emitting display, at least two additional requirements have to be met compared to fabricating a monochrome organic light-emitting display:

(1) each one of the plurality of anodes or each one of the plurality of cathodes of the monochrome display is further partitioned to provide sets of three laterally spaced subpixels; and (2) each subpixel of a set of subpixels must be capable of emitting one of red, green, and blue light, respectively, so that an observer of the full-color organic light-emitting display perceives the full-color capability similar to that perceived in watching a full-color television display or a full-color liquid crystal display Full-color organic light-emitting displays meeting the aforementioned requirements can be grouped into two basic designs and corresponding methods of making the displays:

(i) a display having the subpixel pattern of the cathodes or the subpixel pattern of the anodes is fabricated as a monochrome light-emitting display having a light emission in a blue spectral region, i.e., each subpixel is capable of emitting blue light when addressed by an electrical drive signal; and a color conversion medium oriented with respect to the subpixels and capable of converting blue light emitted from a corresponding subpixel into one of red and green light, and capable of transmitting the blue light emitted by a corresponding subpixel, respectively; designs of this grouping are exemplified by disclosures of Tang et al. in U.S. Pat. No. 5,294,870, with a particularly preferred form of such a display described with reference to FIGS. 4, 5, and 6 thereof;

(ii) the organic EL medium, or at least an organic light-emitting layer thereof, is patterned directly in forming the display and in correspondence with the subpixel pattern of the electrodes; and the organic light-emitting layer within each subpixel is formed of an organic light-emitting host material and a fluorescent dopant selected to provide one of red, green, and blue light emission directly from a corresponding subpixel; exemplary of this second group of full-color organic light-emitting displays is an image display device disclosed by Tang et al. in U.S. Pat. No. 5,294,869, with particularly preferred embodiments described with reference to FIGS. 15, 17, and 18 thereof.

A feature of a display device fabricated in accordance with the first design group of devices is that each subpixel is formed of one and the same blue light-emitting organic EL medium. A principal disadvantage is that the color conversion medium of this device is spaced in a vertical direction from the EL medium of each of the corresponding subpixels, and a potential reduction of luminous efficiency due to a conversion efficiency which is less than 100 percent for converting the blue light into green and red light, respectively.

A feature of an image display device constructed in accordance with the second group of devices is a potentially enhanced luminous efficiency (since no conversion is required). In order to more fully appreciate one impediment to reliably and reproducibly fabricate such a display, the current method of fabrication will be briefly reviewed as follows.

The organic thin films of the light-emitting display are formed by vapor phase deposition (evaporation or sublimation) in successive deposition steps within a vacuum system which employs a deposition rate control. When a fluorescent dopant is to be uniformly incorporated within an organic light-emitting layer of a light-emitting host material, the light-emitting host material and the fluorescent dopant material are co-deposited from two independently controlled deposition sources. Thus, for example, the light-emitting host material and a fluorescent dopant material selected to provide red light emission from a designated subpixel, are co-deposited from two independently controlled deposition sources. Similarly, a subpixel designated for green light emission has its doped light-emitting layer formed by co-deposition of a host material and a fluorescent dopant material capable of providing green light emission. The same deposition process is followed for the subpixel designated to emit blue light or spectrally modified blue light.

It has been found to be difficult to reliably control the deposition rate of a fluorescent dopant when a desired dopant concentration in the host material of an organic light-emitting layer is at or near a lower end of a dopant concentration range of about $10^{-3}$ to about 10 mole percent. The difficulty of reliably controlling the deposition rates of an organic light-emitting host material and of a fluorescent dopant material has been an impediment in the process of reproducibly fabricating full-color organic light-emitting displays, particularly when more than one fluorescent dopant is to be incorporated in the light-emitting layer of a subpixel so as to tailor the hue of the red, green, or blue light emitted from a corresponding subpixel.

SUMMARY OF THE INVENTION

It is an object of the present invention to overcome the deposition problems of fluorescent dopants.

This object is achieved in a method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a substrate;

b) providing a first set of addressing electrodes over the substrate;

c) forming an organic hole-transporting layer over the first set of addressing electrodes and over the substrate;

d) forming an organic light-emitting layer over the hole-transporting layer and having a light-emitting material selected to produce blue light;

e) forming a dopant layer over the light-emitting layer and patterning such dopant layer to form color subpixels which comprise a pixel wherein the colored subpixels are formed by diffusing the patterned dopant layer into the light-emitting layer;

f) forming an organic electron-transporting layer over the doped light-emitting layer; and g) forming a second set of addressing electrodes over the electron-transporting layer so that the color subpixels can be individually addressed.

ADVANTAGES

By separating the depositing step of an organic light-emitting layer from the depositing step of a fluorescent dopant layer, each of these layers can be formed separately to a desired thickness, thereby obviating the problems of deposition rate control associated with the prior art method of forming a doped light-emitting layer. Thus, the deposition processes are greatly simplified and require equipment of reduced complexity.

The light-emitting layer of the organic light-emitting host material can be formed by conventional vapor deposition (evaporation, sublimation) and, alternatively, by solution coating of a polymeric organic light-emitting host material, thereby providing a wider choice of light-emitting materials and deposition methods.

Ink-jet printing of patterns of dopants can be readily performed by utilizing commercially available ink-jet printing apparatus. Ink-jet printing of dopants permits deposition of dopant patterns having relatively high spatial resolution.

Forming dopants over an organic layer of an organic EL medium by ink-jet printing of dopants is compatible with the materials comprising the EL medium.

Ink-jet printable compositions can be readily formulated to contain more than one fluorescent dopant selected to specifically tailor the hue of light emitted from color subpixels of a full-color organic light-emitting display.

Diffusing the dopants as a pattern from the patterned dopant layers into an organic light-emitting layer in a one-step process provides simplicity, process control, and enhanced throughput of display panels in a manufacturing environment.

BRIEF DESCRIPTION OF THE DRAWINGS

FIGS. 10, 10A, 10B, 10C, 10D, 10E, and 10F depict a sequence of process steps in accordance with a still further aspect of the present invention, in which dopant layers of three different dopants are sequentially ink-jet printed over an organic hole-transporting layer, an organic light-emitting layer is deposited over the dopant layers and over the hole-transporting layer, and the dopants are diffused together into the light-emitting layer to form the designated red, green, and blue light-emitting subpixels.

Since device feature dimensions such as layer thicknesses are frequently in sub-micrometer ranges, the drawings are scaled for ease of visualization rather than for dimensional accuracy.

DESCRIPTION OF THE PREFERRED EMBODIMENTS

The acronym EL is in some instances employed for the term "electroluminescent". The term "pixel" is employed in its art recognized usage to designate an area of an image display array that can be stimulated to emit light independently of other areas. The term "full-color" is employed to describe an organic light-emitting display capable of emitting light in the red, green, and blue regions of the visible spectrum in different areas (subpixels) of a single pixel.

Where the terms "red", "green", or "blue" are used herein in conjunction with the term "dopant", such terms are used as abbreviated designations of respective dopants which are capable of providing red light, green light or blue light emission from a light-emitting layer having a host material which, in an undoped form, is selected to emit light in a blue region of the visible spectrum.

The drawings of the devices shown for purposes of illustrating the methods of making same, are necessarily of a schematic nature, since the thicknesses of the individual layers are too thin, and thickness differences of the various elements are too great to permit depiction to scale or to permit convenient proportionate scaling.

In the following description of the various methods and process sequences used for making a full-color organic light-emitting display in accordance with aspects of the invention, corresponding elements have been designated with corresponding numerals. Exceptions to this correspondence will be discussed in more detail as they arise.

Figure 1:
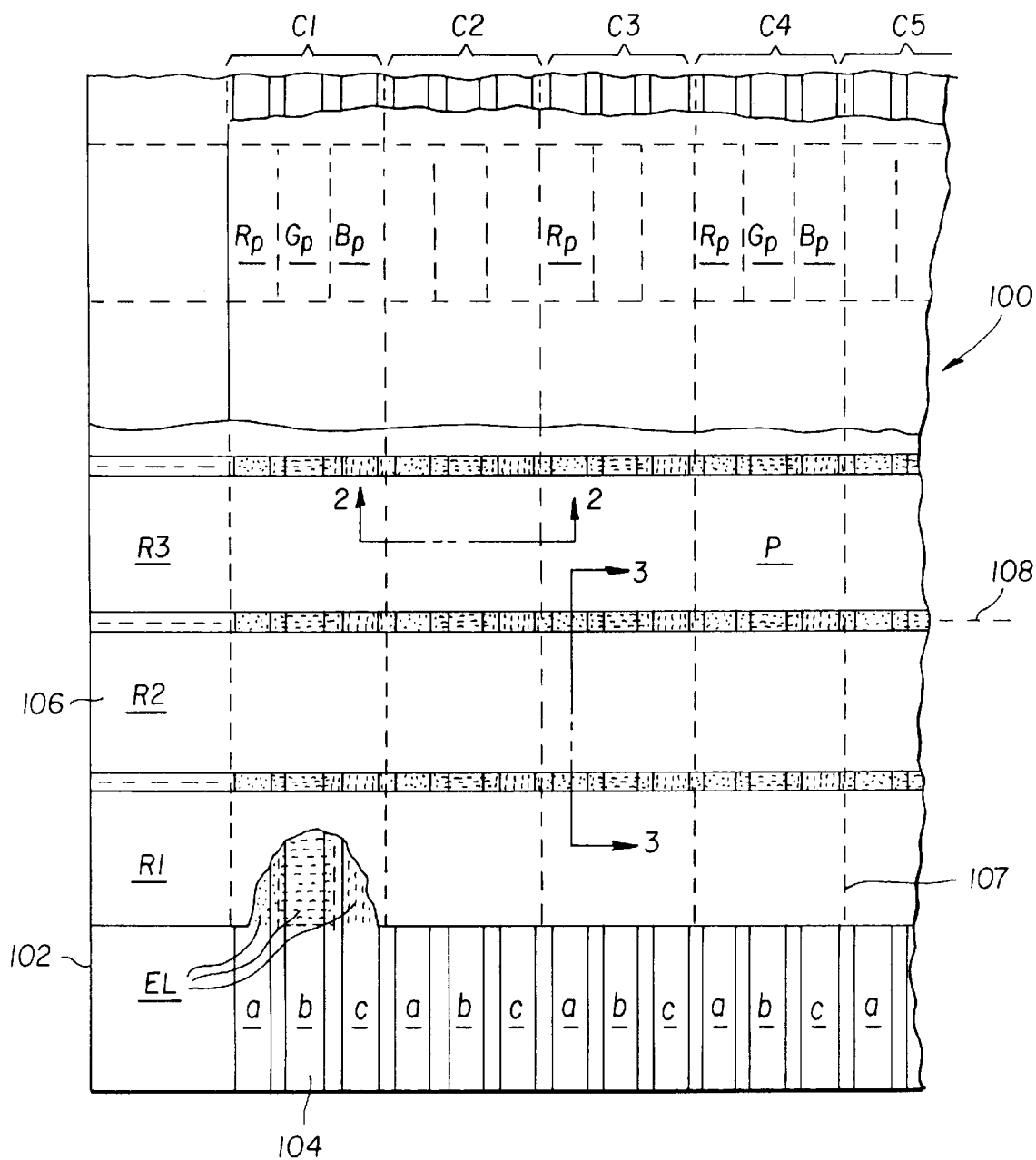
FIG. 1 is a schematic plan view with portions broken away of a full-color organic light-emitting display, defining rows and columns, and an array of pixels comprised of red, green, and blue light-emitting subpixels arranged in sets along a column direction.

Referring to FIG. 1, a full-color organic light-emitting display 100 is formed on a light transmissive and electrically insulative substrate 102. The portion of the display 100 is shown to have an array of light-emitting pixels P arranged at intersections between columns C1–C6 and rows R1–R3. Each pixel P is partitioned into sets of three subpixels $R_p$, $G_p$, and $B_p$, designated to emit red, green, and blue light, respectively, from an organic electroluminescent medium EL. The sets of subpixels are arranged along corresponding subpixels columns designated at a, b, and c. Each subpixel column is electrically addressed to emit light by applying an electrical drive voltage between corresponding light transmissive subpixel column electrodes designated at 104 and row electrodes designated at 106, from a clocked drive voltage source (not shown) so as to commence the display of one frame of information at the intersection between a subpixel column position "a" of the column C1 and the row R1. In the arrangement of the subpixels depicted in FIG. 1, the organic EL medium in this subpixel position $R_p$ would emit red light. A center line 107 is indicated between two adjacent laterally spaced subpixel column electrodes 104 (repeating sets of subpixel columns a, b, and c) and a center line 108 is indicated between adjacent laterally spaced row electrodes 106 of rows R1, R2, and R3.

Figure 2:
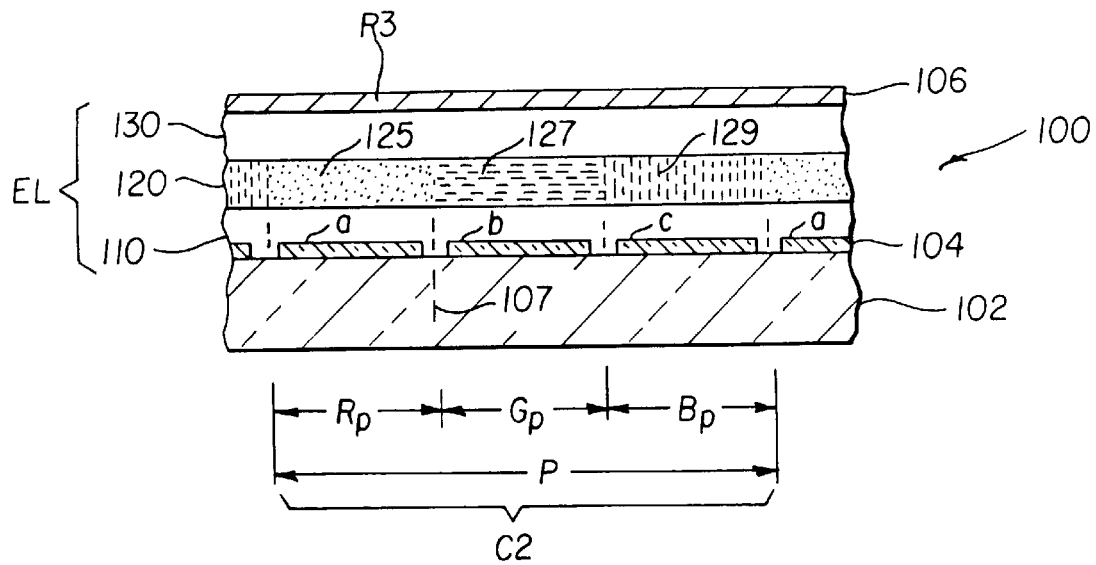
FIG. 2 is an enlarged sectional view of three subpixels taken along the section lines 2—2 of FIG. 1.

Turning now to FIG. 2, the display 100 is shown in an enlarged cross sectional view taken along the lines 2—2 of FIG. 1. A set of three color subpixels $R_p$, $G_p$, and $B_p$ form the column C2 intersecting the row R3.

Disposed on the light transmissive and the electrically insulative substrate 102 is a set (a, b, c) of light transmissive subpixel column electrodes 104 which are laterally spaced, as indicated by center line 107. Formed over the subpixel electrodes and over the substrate at the lateral spacings is an organic EL medium comprised of, in sequence, an organic hole-transporting layer 110, an organic light-emitting layer 120 which is also capable of transporting electrons, and an organic electron-transporting layer 130. A row electrode 106 corresponds to the row R3.

In an undoped form, the light-emitting layer 120 is formed of an organic light-emitting host material selected to emit light in a blue region of the visible spectrum (also referred to in abbreviated form as a blue spectral region), as will be described in more detail with reference to FIG. 4. The light-emitting layer 120 shows schematically three doped regions which are laterally aligned with respect to each of the corresponding subpixel columns a, b, and c, of the subpixel column electrodes 104. A red light-emitting dopant 125 is shown uniformly dispersed in the light-emitting layer 120 to provide the red subpixel $R_p$. Similarly, a green light-emitting dopant 127 is dispersed uniformly in the light-emitting layer 120 and in a pattern which is spatially centered over the subpixel electrode b to provide the green subpixel $G_p$. Likewise, a blue light-emitting dopant 129 is uniformly dispersed in the light-emitting layer 120 so as to modify or fine tune the hue of the blue light emitted from an undoped light-emitting organic light-emitting host material.

Figure 3:
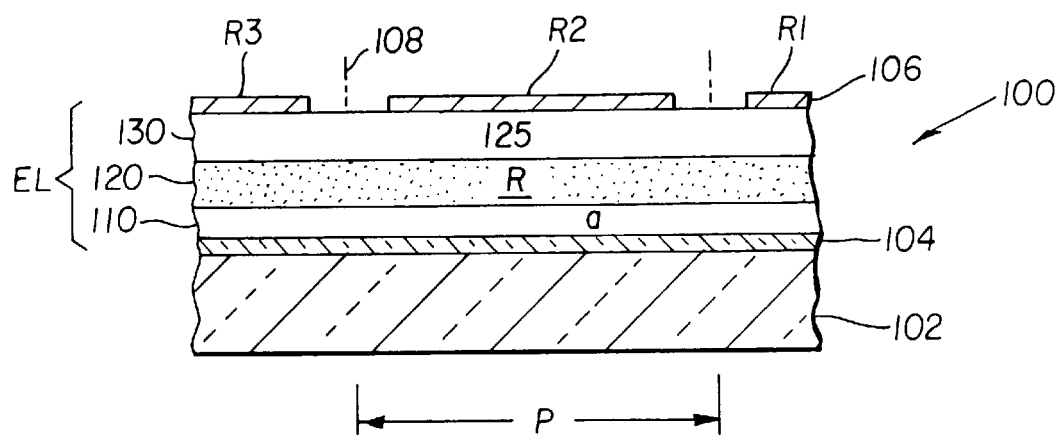
FIG. 3 is an enlarged schematic sectional view taken along the section lines 3—3 of FIG. 1.

Referring now to FIG. 3, the display panel 100 is depicted in cross sectional view taken along the lines 3—3 of FIG. 1 along the subpixel $R_p$. A pixel P is defined as extending between center lines 108 of the laterally spaced row electrodes 106 at row R2.

Figure 4:
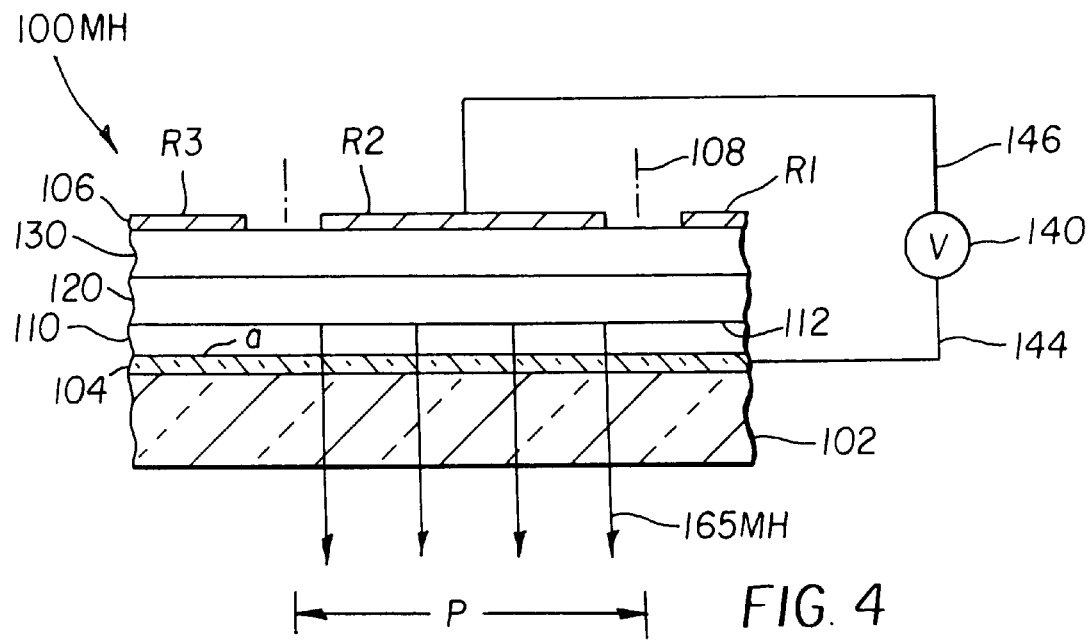
FIG. 4 is a sectional view similar to FIG. 3, and shown for illustrative purposes only as emitting monochrome host light in response to the application of a drive voltage between opposing electrodes.

Referring to FIG. 4, a monochrome host light-emitting display 100MH is shown in a cross sectional view similar to that depicted in FIG. 3. The organic light-emitting layer 120 is formed of an undoped organic light-emitting host material. A junction 112 is formed at an interface between the hole-transporting layer 110 and the light-emitting layer 120 which is also capable of transporting electrons. The subpixel electrode 104 and the row electrode 106 of the row R2 are connected to an external power source 140 (drive voltage supply) by leads 144 and 146, respectively. The source 140 can be a continuous direct current or alternating current voltage source or an intermittent current voltage source. Any convenient conventional power source, including any desired switching circuitry, can be employed which is capable of sequentially addressing the subpixels of the display by biasing the subpixel column electrodes 104 (a, b, c, etc.) positively with respect to the row electrodes 106 of rows R1, R2, R3, etc.

The internal junction 112 can be viewed as a diode which is forward biased when the subpixel column electrode is at a more positive potential than the row electrode 106 of the row R2, depicted here for illustrative purposes only. Under these conditions, injection of holes (positive charge carriers) occurs from the electrode 104 into the hole-transporting layer 110, while electrons (negative charge carriers) are injected from the electrode 106 into the organic electron-transporting layer 130. The injected holes and electrons each migrate toward the oppositely charged electrode, and hole-electron recombination occurs at or near the junction 112. When a migrating electron drops form its conduction band potential to a valance band in filling a hole, energy is released as light. Since the light-emitting layer 120 is undoped and of a light-emitting host material selected to produce blue light, the emitted light 165MH is reflective of the monochrome host material and is shown with straight arrows originating at or near the junction 112 and being transmitted through the light transmissive hole-transporting layer 110, the light transmissive subpixel electrode 104, and the light transmissive substrate 102 for viewing by an observer.

Figure 5:
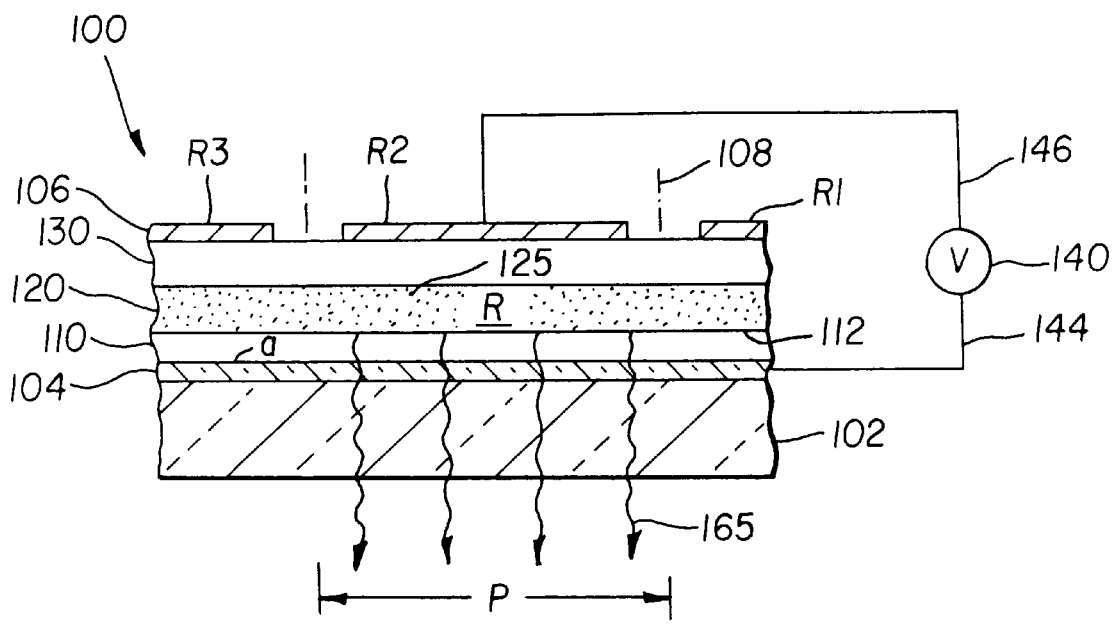
FIG. 5 is a cross sectional view similar to that shown in FIG. 3, and providing a light emission from a doped light-emitting layer in response to the application of a drive voltage between opposing electrodes.

Turning to FIG. 5, the panel 100 is shown to have a dopant 125 uniformly dispersed within the light-emitting layer 120, the dopant selected to produce red light emission from the light-emitting layer, shown as emitted light 165 and indicated by wavy arrows.

The light transmissive substrate 102 is electrically insulative and can be selected from glass, quartz, and plastic materials. The subpixel column electrodes 104 (a, b, c, etc.) are formed of a subpixel material selected to provide hole injection from the electrodes 104 into the hole-transporting layer 110. Suitable materials include indium oxide, tin oxide, and indium tin oxide (ITO). The hole-transporting layer 110 is preferably formed over the sets of subpixel column electrodes and over the substrate by vapor depositing an organic hole-transporting material. Following the teachings of VanSlyke et al., U.S. Pat. No. 4,539,507, the hole-transporting material is preferably selected from the group consisting of aromatic tertiary amines.

The organic light-emitting layer 120 can be formed by vapor depositing an organic light-emitting host material to a desired thickness. Particularly preferred host materials for forming the blue light-emitting layer 120 are metal chelated oxinoid compounds, as disclosed in the Tang et al. U.S. Pat. No. 4,769,292 cited above. Particularly preferred metal chelated oxinoid compounds are mixed ligand aluminum chelates as the type disclosed by VanSlyke et al., U.S. Pat. No. 5,150,006.

Alternatively, the blue light-emitting layer 120 can be formed by solution coating of a polymeric organic blue light-emitting host material. Examples of polymeric blue light-emitting host materials suitable for solution coating include polyparaphenylene vinylenes (PPV), PPV copolymers, polyanilines, poly-3-alkylthiopenes, poly-3-octylthiopenes, and polyparaphenylenes.

The electron-transporting layer 130 is preferably formed by vapor depositing an organic electron-transporting material which is also preferably a metal chelated oxinoid compound. The row electrodes 106 can be vapor deposited, and of a material selected to provide electron injection from each row electrode into the electron-transporting layer 130. Following the teachings of Tang et al. in the aforementioned U.S. Pat. No. 4,769,292, particularly preferred row electrode materials are composite materials comprised of a low work function metal (a work function smaller than 4.0 eV) and a second metal which preferably has a work function greater than 4.0 eV, which includes metals more resistant to oxidation and which are therefore more commonly fabricated as metallic layers.

The lateral spacing between the row electrodes 106 corresponding to the rows R1, R2, and R3 can be provided by depositing these electrodes from the vapor phase through apertures in a shadow mask positioned in close proximity to the electron-transporting layer 130, and having apertures corresponding to the row electrodes to be formed and oriented with respect to orientation marks (not shown) disposed around a peripheral region on the substrate 102.

Alternatively, the lateral spacing between adjacent row electrodes can be provided by forming integral shadow masks on the substrate 102 and configured in a manner similar to the integral shadow mask walls described in the aforementioned Tang et al. U.S. Pat. Nos. 5,294,869 and 5,294,870.

Figure 6A:
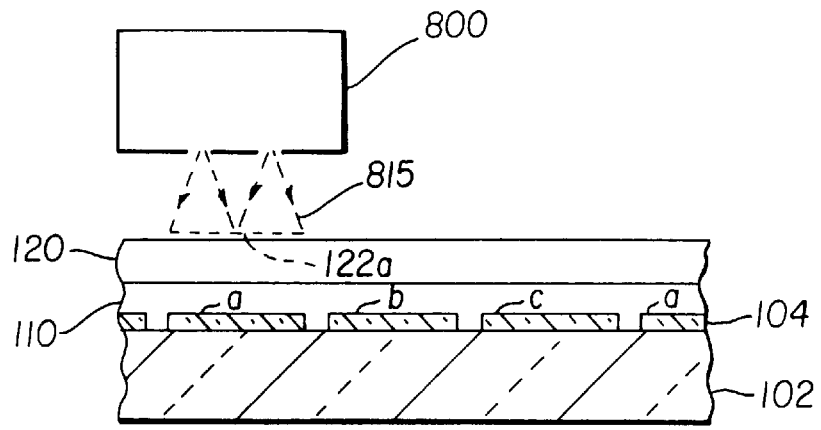
FIGS. 6A, 6B, and 6C are sectional views depicting a sequence of process steps of forming a selectively doped light-emitting layer aligned with respect to a designated subpixel column electrode, in accordance with one aspect of the present invention.
Figure 6B:
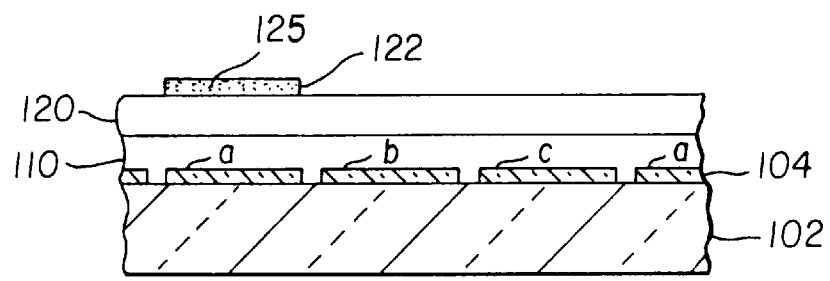
Figure 6C:
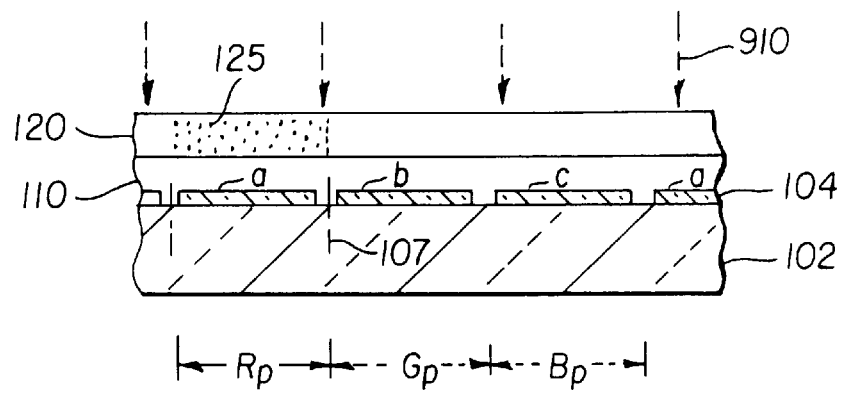

Referring now to FIGS. 6A, 6B, and 6C, the steps of the inventive method of forming a dopant layer by ink-jet printing over a light-emitting layer and diffusing the dopant from the dopant layer into the light-emitting layer are illustrated for a "red" dopant.

In FIG. 6A, an organic hole-transporting layer 110 has been formed over the subpixel column electrodes, and an undoped light-emitting host layer 120 has been formed over the hole-transporting layer. An ink-jet print head 800 of a commercially available ink-jet printer (not shown) provides a "red" dopant ink-jet 815 which is being scanned in a direction (normal to the plane of the drawing) along the subpixel column a and in alignment therewith to provide a growing dopant layer 122a (shown in dashed outline) of a "red" dopant over the light-emitting layer 120.

FIG. 6B shows the completed dopant layer 122 containing the "red" dopant 125 shown in dotted outline, and formed in alignment with respect to the subpixel column a of the subpixel column electrodes 104.

In FIG. 6C, a dopant diffusing step is schematically indicated by dashed arrows 910 which represent a vapor of a fluid or of a fluid mixture selected to provide molecular diffusion paths in the light-emitting layer 120 so as to permit uniform diffusion of the dopant 125 from the dopant layer 122 into the light-emitting layer. During the diffusing step, the dopant 125 will diffuse laterally by a small distance (not shown) so that the lateral boundaries of the doped portion of the light-emitting layer 120 coincide with the center lines 107 of the lateral spacing between adjacent subpixel columns. Thus, the dopant 125 forms a red light-emitting subpixel column $R_p$.

The steps of ink-jet printing a dopant layer and diffusing the dopant or dopants into the light-emitting layer are repeated to form each of the $G_p$ and $B_p$ subpixel columns.

Figure 7A:
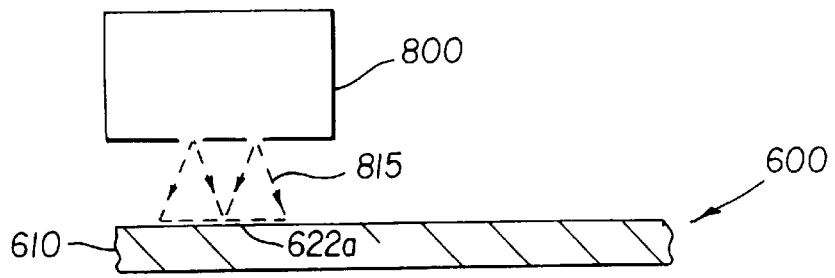
FIGS. 7A, 7B, 7C, and 7D show a process sequence for forming a dopant layer over a light-emitting layer by thermally transferring a dopant from the dopant donor layer which was formed on a donor support by ink-jet printing, in accordance with another aspect of the present invention.
Figure 7B:
Figure 7C:
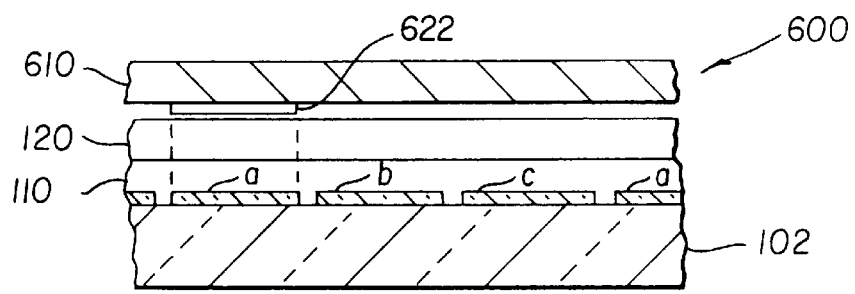
Figure 7D:
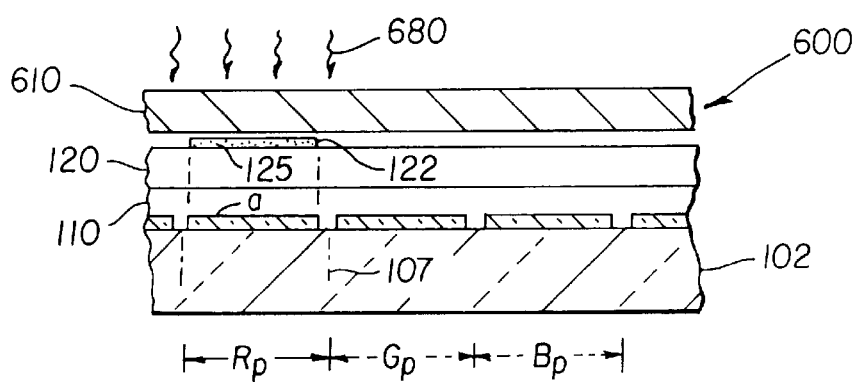

FIGS. 7A–7D illustrate an alternative method of forming a dopant layer 122 over the light-emitting layer 120 (FIG. 7D).

In FIG. 7A, a dopant donor assembly 600 comprises a donor support 610 on which is printed by ink-jet printing a growing dopant donor layer 622a of a "red" dopant from an ink-jet 815. The completed dopant donor layer 622 is shown on the donor support 610 in FIG. 7B, and is comprised of the "red" dopant 625.

In FIG. 7C, the dopant donor assembly 600 is shown inverted and disposed in close proximity and substantially parallel to the surface of the light-emitting layer 120, and oriented or aligned with respect to orientation marks or alignment marks (not shown) disposed along a peripheral region of the substrate 102.

In FIG. 7D, heat radiation 680 is used to heat the donor support 610 so that the dopant donor layer 622 of FIG. 7C vaporizes or sublimes, thereby transferring the donor layer from the donor support 610 to the light-emitting layer 120 to form the dopant layer 122 thereon of the "red" dopant 125, and in alignment with the subpixel column a. The dopant diffusing step previously described with reference to FIG. 6C can now be used to diffuse the dopant 125 from the dopant layer 122 into the light-emitting layer 120 to form the red light-emitting subpixel column $R_p$.

In the practice of this aspect of the invention, it is preferred to sequentially ink-jet print dopant donor layers of "red", "green", and "blue" dopants on the donor support 610, and in spatial alignment with the $R_p$, $G_p$, and $B_p$ subpixel columns to be formed, and to thermally transfer the dopants together so as to form corresponding dopant layers over the light-emitting layer 120.

Figure 8A:
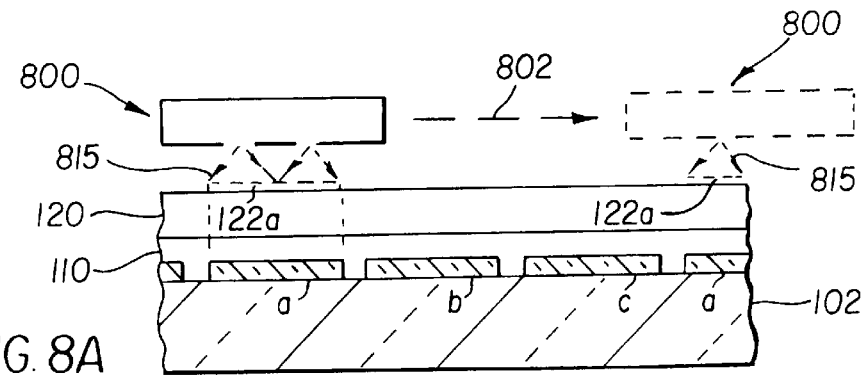
FIGS. 8A, 8B, 8C, 8D, and 8E depict a sequence of process steps of sequentially forming three different dopant layers by sequential ink-jet printing the dopants over a light-emitting layer, and diffusing the dopants together as a pattern from the dopant layers into the light-emitting layer to form the red, green, and blue light-emitting subpixels, in accordance with another aspect of the present invention.
Figure 8B:
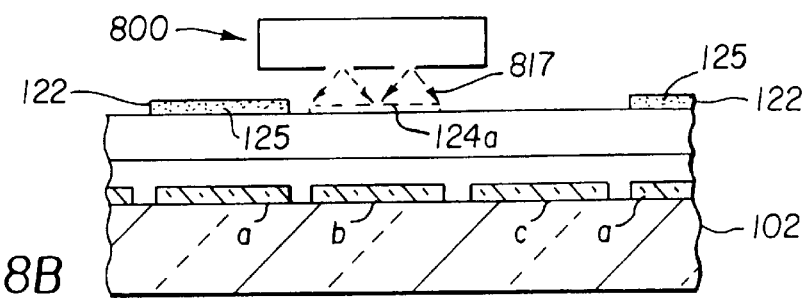
Figure 8C:
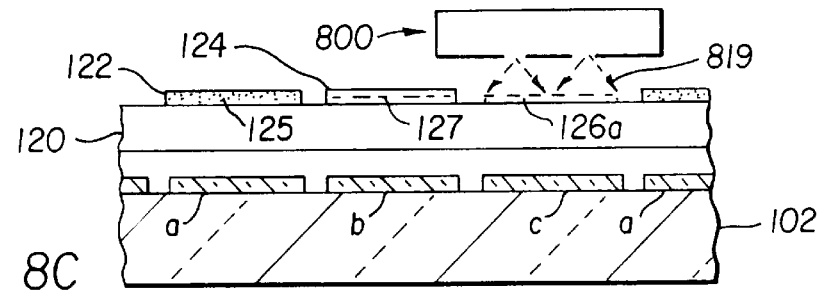
Figure 8D:
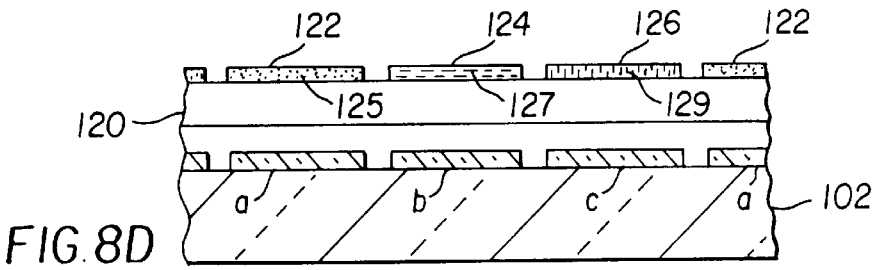

Turning now to FIGS. 8A–8E, a sequence of process steps are shown in accordance with one aspect of the method of the present invention, in which a dopant layer 122 of a "red" dopant, a dopant layer 124 of "green" dopant, and a dopant layer 126 of "blue" dopant are formed sequentially by sequential ink-jet printing of these dopant layers over a light-emitting layer 120 (FIG. 8D).

For illustrative purposes only, and to maintain clarity of the description, all dopant layers 122 of the "red" dopant will be formed first in the sequence of dopant layer forming steps. In FIG. 8A, an ink-jet print head 800 (shown in solid outline) first provides a "red" dopant ink-jet 815 to form a growing dopant layer 122a (shown in dashed outline) of a "red" dopant over the light-emitting layer and in alignment with respect to the subpixel column "a" shown at the left side of the drawing. The ink-jet print head 800 is then laterally translated as indicated by the dashed arrow 802 to a position (shown in dashed outline) for ink-jet printing a growing dopant layer 122a of the "red" dopant over the light-emitting layer 120, and in alignment with a subpixel column "a" of an adjacent set of subpixel columns, as shown at the far right location of the drawing.

Similarly, an ink-jet print head 800 provides a "green" dopant ink-jet 817 to form a growing dopant layer 124a of a "green" dopant and aligned with respect to subpixel columns b.

In a similar manner, an ink-jet print head 800 then uses a "blue" dopant ink-jet 819 to form a growing dopant layer 126a of a "blue" dopant over the light-emitting layer 120, and in alignment with respective subpixel columns c.

The dopant layers 122, 124, and 126 of FIG. 8D each contain at least one dopant. For example, the dopant layer 122 of "red" dopant contains at least one "red" dopant 125, the dopant layer 124 of "green" dopant contains at least one "green" dopant, and the dopant layer 126 of "blue" dopant contains at least one "blue" dopant 129.

Figure 8E:
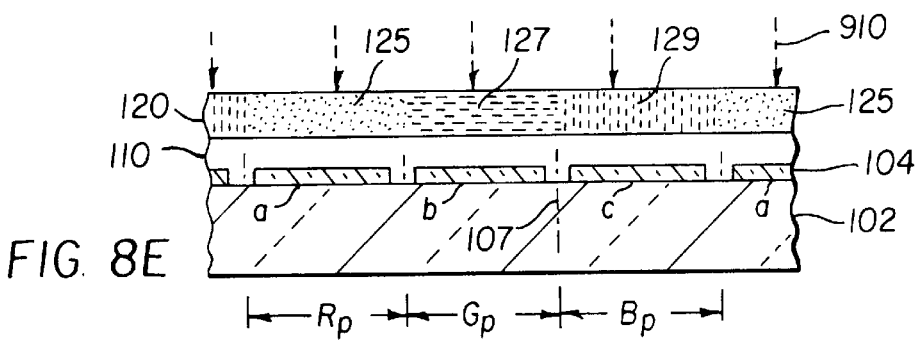

FIG. 8E indicates the dopant diffusing step in which the dopants 125, 127, and 129 are diffused together from the corresponding dopant layers 122, 124, and 126 as a pattern into the light-emitting layer 120 to be uniformly dispersed therein and to thereby provide the red light-emitting, green light-emitting, and blue light-emitting subcolumns $R_p$, $G_p$, and $B_p$.

Each of the ink-jets 815, 817, and 819 comprises an ink-jet printable composition which includes at least one printing fluid and at least one dopant. To provide the dopant layers 122, 124, and 126 over the light-emitting layer 120, as shown in FIG. 8D, a printing fluid or a mixture of printing fluids is selected such that the fluid or fluids will not penetrate the light-emitting layer 120, and vapor or vapors of such printing fluid will not provide molecular diffusion paths for the dopant in the light-emitting layer. Aqueous printing fluids are preferred printing fluids because they are non-penetrating, and vapors of aqueous printing fluids do not provide molecular diffusion paths in a light-emitting layer. Thus, the dopant diffusing step is carried out by exposing the dopant layers and the light-emitting layer 120 to fluid vapor 910 in a vapor treatment system subsequent to ink-jet printing of the dopant layers.

The dopant or dopants of each ink-jet printable composition are fluorescent dyes whose propensity for emitting light in response to hole-electron recombination has been well established in organic light-emitting devices of the prior art in which both a blue light-emitting host material and a fluorescent dopant were co-deposited from the vapor phase. Following the teachings of Tang et al, in the U.S. Pat. Nos. 4,769,292 and 5,294,869 cited previously, especially preferred fluorescent dyes suitable for formulating each of the ink-jet printable compositions are fluorescent dyes selected from dye classes consisting of coumarin, dicyanomethylenepyrans and thiopyrans, polymethine, oxabenzanthracene, xanthene, pyrylium and thiapyrylium, carbostyril, and perylene fluorescent dyes.

As indicated above, the hue of light emission associated with each of the fluorescent dopants dispersed in the light-emitting layer 120 may be adjusted or fine tuned to meet or to exceed certain color standards for red, green, and blue light emitted from subpixels of the light-emitting display. Such color standards are frequently expressed in a so-called CIE color diagram as color coordinates.

Each one of the ink-jet printable compositions is filled into a separate ink-jet printing cartridge (not shown) which is inserted into the ink-jet print head 800 in a well known manner. After ink-jet printing the dopant layers over the light-emitting layer 120 and in correspondence with respective subpixel columns a, b, c, etc., the ink-jet printing cartridge is removed form the ink-jet print head and an ink-jet printing cartridge containing the second dopant or dopants is inserted into the print head, and so forth.

Figure 9A:
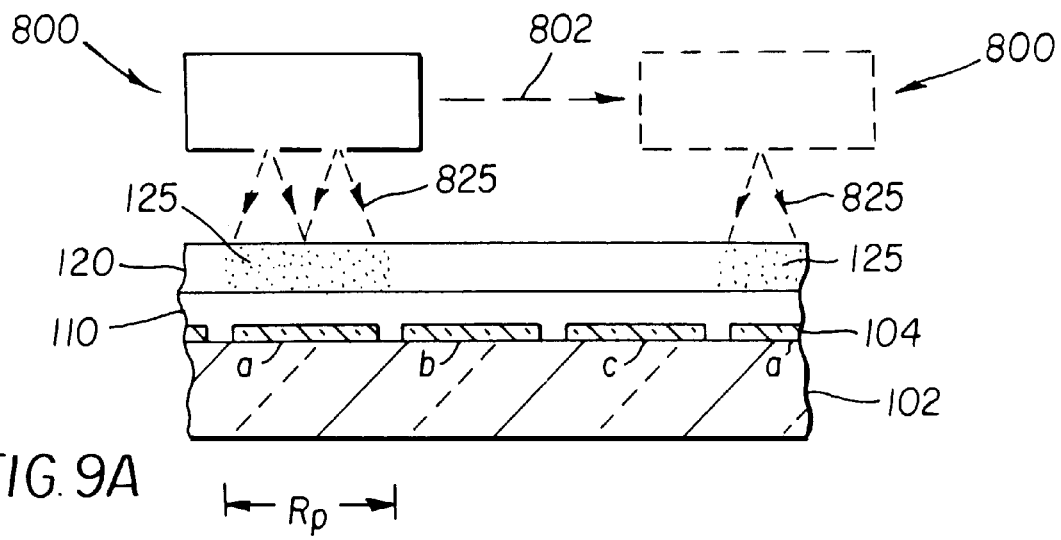
FIGS. 9A, 9B, and 9C depict a sequence of process steps in accordance with a further aspect of the present invention, in which three different fluorescent dopants are sequentially ink-jet printed on a light-emitting layer, and from a printing composition which permits printing and diffusion into the light-emitting layer of the dopants.
Figure 9B:
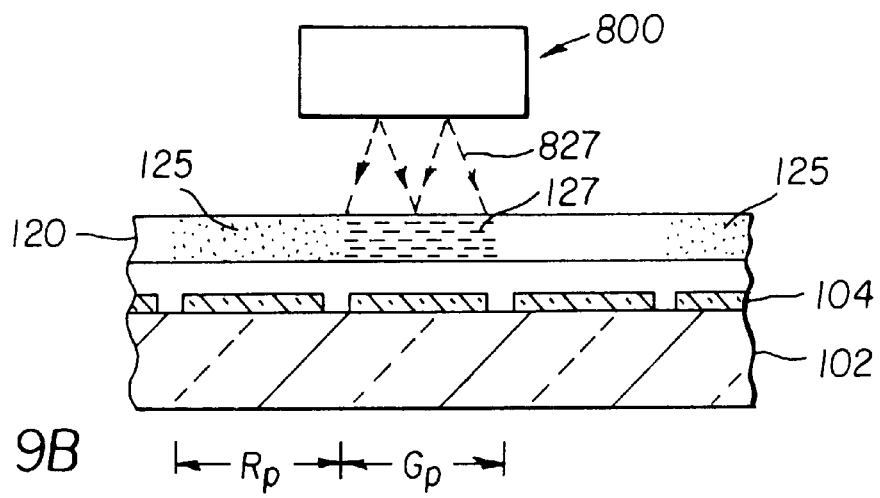
Figure 9C:
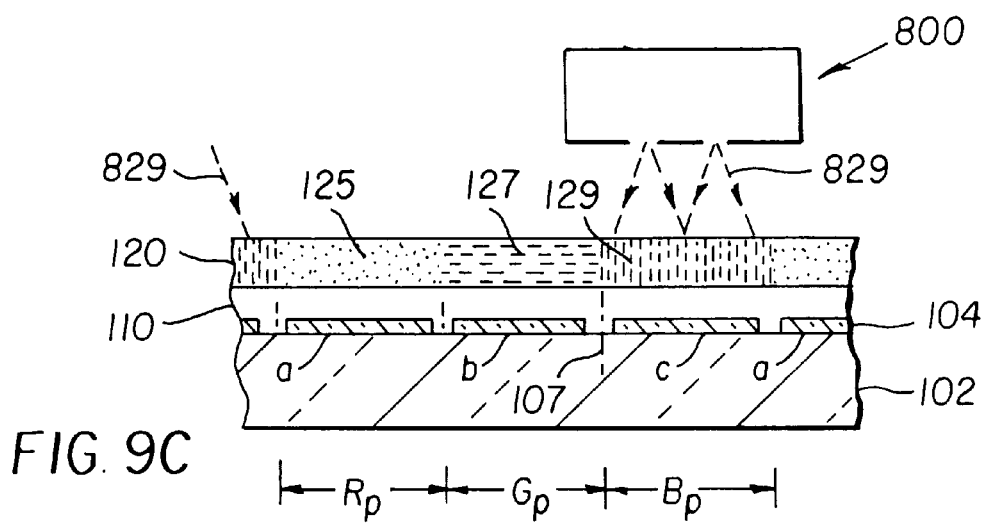

Referring to FIGS. 9A, 9B, and 9C, a sequence of only three process steps is shown in a method of making a full-color organic light-emitting display. This method differs from the aforementioned methods of first forming dopant layers over the light-emitting layer 120 by ink-jet printing of dopants and subsequently diffusing the dopants into the light-emitting layer, in that modified ink-jet printable compositions are formulated to include at least one printing fluid providing printing fluid vapors capable of forming molecular diffusion paths in the light-emitting layer 120 for diffusing the respective dopant into the light-emitting layer during the ink-jet printing step.

Thus, in FIG. 9A, a "red" dopant ink-jet 825 contains at least one printing fluid whose printing fluid vapor promotes diffusion of the "red" dopant 125 into the light-emitting layer. Similarly, in FIGS. 9B and 9C, the "green" dopant ink-jet 827 and the "blue" dopant ink-jet 829 each derive from modified ink-jet printable compositions which include at least one printing fluid providing the printing fluid vapors to promote diffusion of the respective dopants into the light-emitting layer during the ink-jet printing step.

Examples of printing fluids which, used alone or in a mixture of printing fluids, can provide vapors capable of forming molecular diffusion paths during the ink-jet printing step are alcohols such as butanol, ethanol, isopropanol, and methanol; ketones such as acetone, butanone, and methyl ethyl ketone; and chlorinated fluids such as dichloromethane.

Turning now to FIGS. 10A–10F, a sequence of steps comprising a method of making a full-color organic light-emitting display in accordance with another aspect of the invention is shown. This method differs from the aforementioned methods in that dopant layers 122, 124, and 126 (see FIG. 10D) are sequentially ink-jet printed over a hole-transporting layer 110 in a manner similar to the sequence of steps described with reference to FIGS. 8A–8D. Accordingly, no further description of the ink-jet printing of the layers will be required.

Figure 10A:
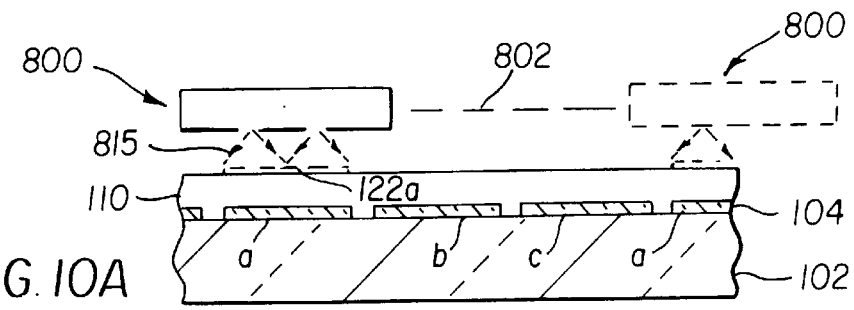
Figure 10B:
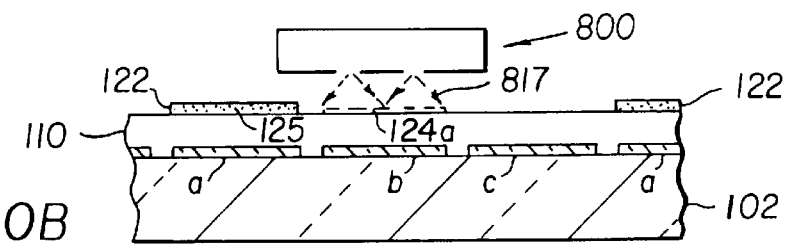
Figure 10C:
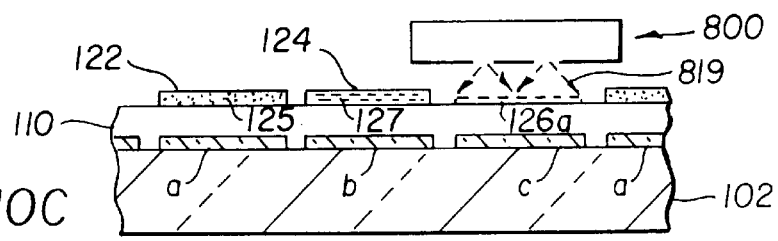
Figure 10D:
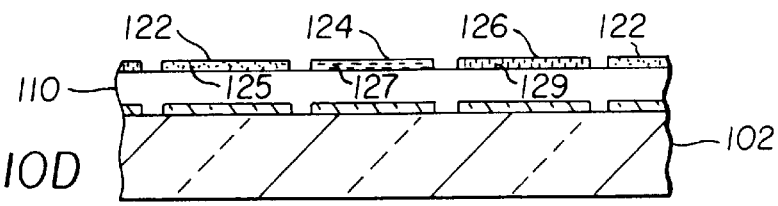
Figure 10E:
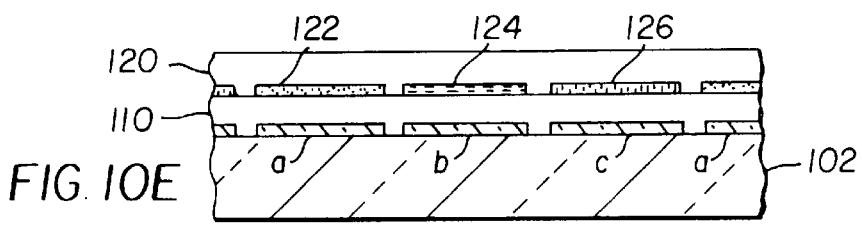

In FIG. 10E, an undoped light-emitting layer 120 is shown formed over the dopant layers 122, 124, and 126 and over the hole-transporting layer 110 within the lateral spacings between the respective dopant layers.

Figure 10F:
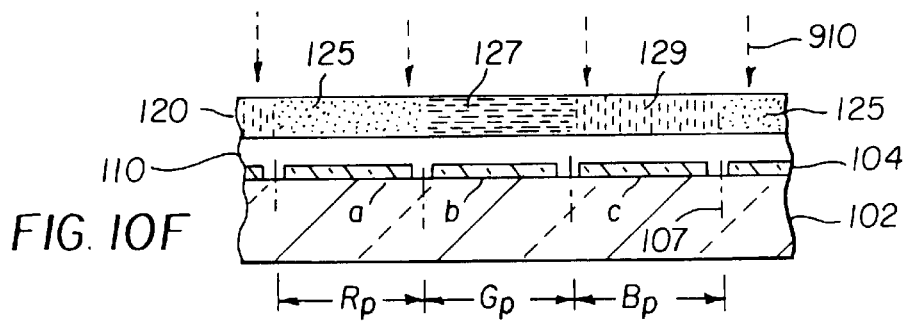

In FIG. 10F, fluid vapor 910 creates molecular diffusion paths in the light-emitting layer 120 and promotes diffusion of the respective dopants 125, 127, and 129 (see FIG. 10D) from the dopant layers into the overlying light-emitting layer, thereby forming the subpixel columns $R_p$, $G_p$, and $B_p$.

While it may appear from the drawings of FIGS. 10E and 10F that the doped light-emitting layer 120 could be lifted off the hole-transporting layer 110 when the dopant layers 122, 124, and 126 substantially vanish as their respective dopants diffuse upwardly into the light-emitting layer 120, it will be appreciated that the dopant layers are formed to a thickness in a range of 0.1 to 1 nm (1–10 Angstrom), i.e., to a thickness of molecular dimensions.

Figure 11A:
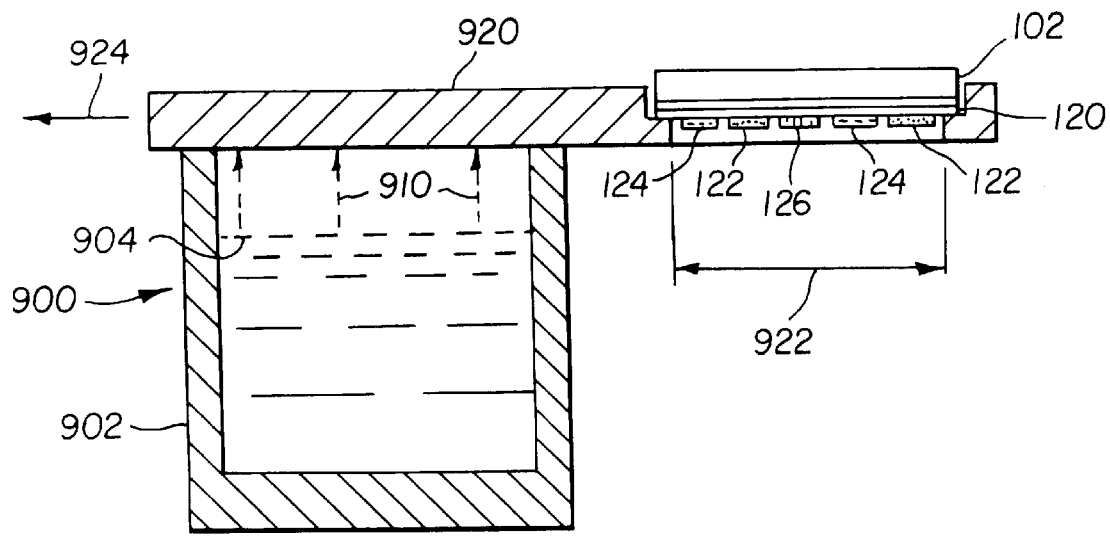
FIGS. 11A and 11B are schematic sectional views of a vapor treatment system useful for diffusing dopants into an organic light-emitting layer in accordance with an aspect of the present invention.
Figure 11B:
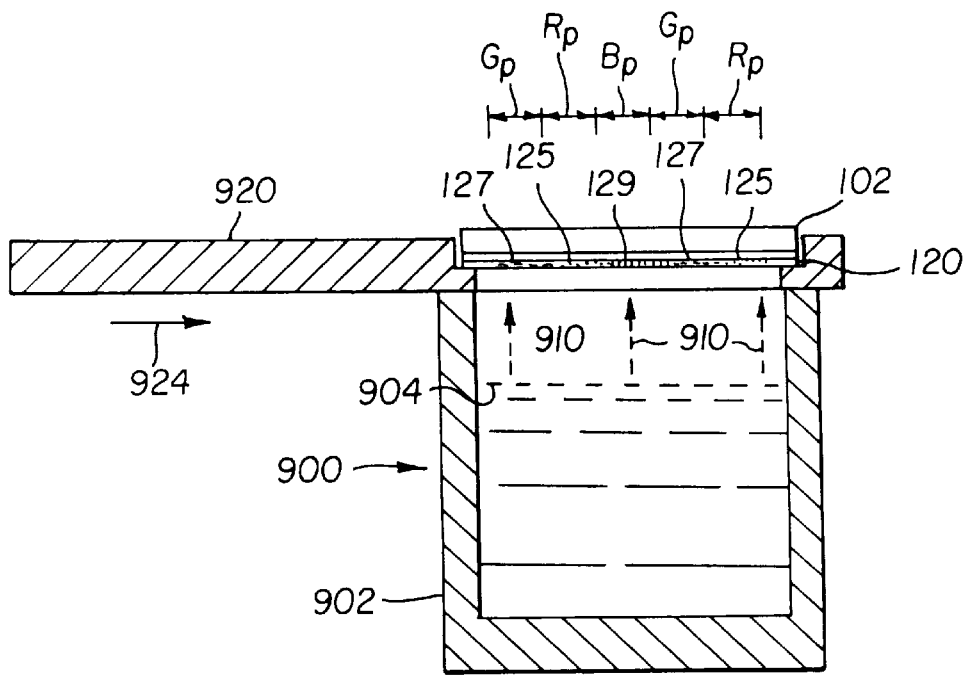

Referring to FIGS. 11A and 11B, a vapor treatment system 900 is schematically indicated comprising a container 902 which contains a vaporizable fluid to a level 904, the fluid producing a fluid vapor 910, shown by dashed arrows, in a volume extending between a sealed sliding cover 920 and the fluid level 904. The sliding cover has a recessed aperture 922 into which can be positioned a panel in preparation for diffusion of a dopant from a dopant layer or of dopants from a plurality of dopant layers into a light-emitting layer. As shown here as an illustrative example only is a panel having a light-emitting layer 120 and overlying dopant layers 122, 124, and 126.

In FIG. 11B, the sliding cover has been translated by a sliding motion as indicated at 924, so as to expose the dopant layers and the light-emitting layer to the fluid vapor 910 for a defined period of time, and to thereby diffuse the dopants from the dopant layers into the light-emitting layer 120.

It will be appreciated that a vapor treatment system can be readily constructed to control vapor formation within the container 902 by heating and/or cooling means (not shown) surrounding the interior or exterior of the container.

Numerous fluids and fluid mixtures can be selected to provide fluid vapors useful for diffusing a dopant from a dopant layer or dopants from a plurality of dopant layers into a light-emitting layer at or near room temperature. For example, fluids and fluid mixtures can be selected from among alcohols such as isopropanol; ketones, such as acetone and 2-butanone; and chlorinated fluids, such as dichloromethane.

EXAMPLES

The following examples are presented for a further understanding of the invention. For purposes of clarity, the materials and the layers formed therefrom will be abbreviated as given below.

Alq: tries(8-quanolinato-N1,08)-aluminum
(light-emitting layer; electron-transporting layer)
DCJTB: 4-(dicyanomethylene)-2-t-butyl-6-(1,1,7,7-tetramthyljulolidyl-9-enyl)-4H-pyran (dopant)

Example 1

A sample, designated for visual observation of photoluminescence, was constructed as follows:

a) on one surface of a transparency foil (type 101 Clear Transparency Film, Eastman Kodak Company, Rochester, N.Y.) was deposited a 10 nm thick layer of an Alq light-emitting host material by conventional vacuum evaporation;

b) an ink-jet printable composition was formulated at $8 \times 10^{-4}$ molar concentration of a DCJTB fluorescent dye dopant in a printing fluid comprised of a mixture of 1 percent dichloromethane and 99 percent isopropanol;

c) a portion of the ink-jet printable composition was filled into an ink-jet printing cartridge for use in a Hewlett-Packard DeskJet printer, Model 560C;

d) the cartridge was inserted into the print head of the DeskJet printer;

e) the printer was actuated so as to print a pattern of the dopant formed over the Alq light-emitting layer, the pattern selected to provide intersecting subpixel rows and columns each having a center-to-center two-subpixel spacing of about 0.022 inch (0.56 mm);

f) the uncoated surface of the transparency foil was exposed to luminescence-exciting ultraviolet radiation having a wavelength of about 390 nm, and the resulting photoluminescence from the Alq light-emitting layer and from the overlying patterned dopant was observed visually under a microscope of a 50× magnification with the following results:

i) the Alq light-emitting layer had a blue-green light emission in regions devoid of the ink-jet printed dopant pattern; and ii) photoluminescence had a yellowish-brown hue in regions having the dopant pattern overlying the Alq layer.

Example 2

The sample of Example 1 was further subjected to a dopant diffusion step in a vapor treatment system shown in FIGS. 11A and 11B, in acetone vapor for 7 seconds. Observation of photoluminescence as described in Example 1 provided the following results:

iii) the Alq light-emitting layer had a blue-green light emission in regions devoid of the ink-jet printed dopant pattern; and iv) photoluminescence had a red hue in regions having the dopant pattern diffused into the Alq layer, the red luminescence being characteristic of molecular dispersion of the DCJTB dopant pattern in the Alq layer of the light-emitting host material.

The invention has been described in detail with particular reference to certain preferred embodiments thereof, but it will be understood that variations and modifications can be effected within the spirit and scope of the invention.

PARTS LIST

| | |
|---|---|
| 100 | full-color organic light-emitting display |
| 100MH | monochrome organic light-emitting display (host light emission) |
| a, b, c | subpixel columns |
| $R_p$ | red light-emitting subpixel column |
| $G_p$ | green light-emitting subpixel column |
| $B_p$ | blue light-emitting subpixel column |
| C1–C5 | columns (full-color sets of subpixel columns) |
| R1–R3 | rows |
| P | pixel |
| 102 | light-transmissive and electrically insulative substrate |
| 104 | light-transmissive subpixel column electrodes |
| 106 | row electrodes |
| 107 | center line between subpixel columns |
| 108 | center line between rows |
| 110 | hole-transporting layer |
| 112 | junction |
| 120 | light-emitting layer of light-emitting host material |
| 122 | dopant layer of "red" dopant |
| 122a | growing dopant layer of "red" dopant during ink-jet printing |
| 124a | growing dopant layer of "green" dopant during ink-jet printing |
| 124 | dopant layer of "green" dopant |
| 125 | "red" dopant |
| 126 | dopant layer of "blue" dopant |
| 126a | growing dopant layer of "blue" dopant during ink-jet printing |
| 127 | "green" dopant |
| 129 | "blue" dopant |
| 130 | electron-transporting layer |
| 140 | voltage supply |
| 144 | lead |
| 146 | lead |
| 165 | emitted light (from doped light-emitting layer) |
| 165MH | emitted light (from monochrome host light-emitting layer) |
| 600 | dopant donor assembly |
| 610 | donor support |
| 622 | dopant donor layer of "red" dopant |
| 622a | growing dopant layer of "red" dopant during ink-jet printing |
| 625 | "red" dopant |
| 680 | heat radiation |
| 800 | ink-jet print head |
| 802 | lateral translation of print head |
| 815 | "red" dopant ink-jet |
| 817 | "green" dopant ink-jet |
| 819 | "blue" dopant ink-jet |
| 825 | "red" dopant ink-jet of modified composition |
| 827 | "green" dopant ink-jet of modified composition |
| 829 | "blue" dopant ink-jet of modified composition |
| 900 | vapor treatment system |
| 902 | container |
| 904 | fluid level |
| 910 | fluid vapor |
| 920 | sliding cover |
| 922 | recessed aperture |
| 924 | lateral translation of sliding cover |

What is claimed is:

1. A method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a substrate;
    b) providing a first set of addressing electrodes over the substrate;
    c) forming an organic hole-transporting layer over the first set of addressing electrodes and over the substrate;
    d) forming an organic light-emitting layer over the hole-transporting layer and having a light-emitting material selected to produce blue light;
    e) forming a dopant layer over the light-emitting layer and patterning such dopant layer to form color subpixels which comprise a pixel wherein the colored subpixels are formed by diffusing the patterned dopant layer into the light-emitting layer;
    f) forming an organic electron-transporting layer over the doped light-emitting layer; and
    g) forming a second set of addressing electrodes over the electron-transporting layer so that the color subpixels can be individually addressed.

2. The method of making a full-color organic light-emitting display in accordance with claim 1 wherein forming the hole-transporting layer includes vapor depositing an organic hole-transporting material selected from the group consisting of aromatic tertiary amines.

3. The method of making a full-color organic light-emitting display in accordance with claim 1 wherein forming the light-emitting layer layer includes includes vapor depositing an organic light-emitting host material selected from the group consisting of metal chelated oxinoid compounds.

4. The method of making a full-color organic light-emitting display in accordance with claim 1 wherein forming the light-emitting layer includes includes solution coating a polymeric organic light-emitting host material selected from the group consisting of polyparaphenylene vinylene (PPV), PPV copolymers, polyanilines, poly-3-alkylthiopenes, poly-3-octylthiopenes, and polyparaphenylenes.

5. The method of making a full-color organic light-emitting display in accordance with claim 1 wherein forming a dopant layer includes ink-jet printing the dopant.

6. The method of making a full-color organic light-emitting display in accordance with claim 5 wherein ink-jet printing the dopant layer includes the steps of:

a) formulating an ink-jet printable composition comprised of at least one printing fluid and at least one dopant;
    b) filling the printable composition into an ink-jet printing cartridge;
    c) aligning the corresponding first addressing electrodes with respect to a printing direction; and
    d) printing the printable composition over the light-emitting layer and in a pattern which includes all first addressing electrodes designated for emitting one of red, green, and blue light.

7. The method of making a full-color organic light-emitting display in accordance with claim 6 wherein the step of formulating the ink-jet printable composition includes selecting at least one fluorescent dye as the dopant.

8. The method of making a full-color organic light-emitting display in accordance with claim 7 wherein the fluorescent dye selecting step includes choosing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

9. The method of making a full-color organic light-emitting display in accordance with claim 1 wherein forming a dopant layer includes the steps of:

a) ink-jet printing on a donor support a dopant donor layer in a subpixel pattern of the dopant;

b) positioning the subpixel pattern of the dopant donor layer in close proximity to the light-emitting layer and in alignment with respect to the first addressing electrodes thereof; and c) transferring the dopant as a subpixel pattern from the dopant donor layer to the light-emitting layer by heating the donor support.

10. The method of making a full-color organic light-emitting display in accordance with claim 1 wherein the step of diffusing the dopant includes exposing the dopant layer and the light-emitting layer to vapor of a fluid or of a fluid mixture selected to provide molecular diffusion paths in the light-emitting layer which permit uniform diffusion of the dopant as patterns into the light-emitting material of the light-emitting layer.

11. The method of making a full-color organic light-emitting display in accordance with claim 1 wherein forming the electron-transporting layer includes vapor depositing an organic electron-transporting material selected from the group consisting of metal chelated oxinoid compounds.

12. The method of making a full-color organic light-emitting display in accordance with claim 1 wherein forming the second set of addressing electrode layer includes vapor depositing electrodes and of a material selected to provide electron injection from the electrodes of the second set into the electron-transporting layer.

13. A method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a light transmissive and electrically insulative substrate;

b) disposing a plurality of laterally spaced light transmissive subpixel column electrodes over the substrate;

c) forming an organic hole-transporting layer over the subpixel column electrodes and over the substrate;

d) sequentially forming a dopant layer over the hole-transporting layer in a pattern corresponding to each of the subpixel column electrodes of each set of subpixel columns and of at least one first dopant selected to produce red light emission, at least one second dopant selected to produce green light emission, and at least one third dopant selected to produce spectrally modified blue light emission from an organic light-emitting layer;

e) forming an organic light-emitting layer over the dopant layers and of a light-emitting host material selected to produce a host light emission in a blue spectral region;

f) diffusing the first, second, and third dopants together from the respective dopant layers into the light-emitting layer to provide a selectively doped light-emitting layer;

g) forming an organic electron-transporting layer over the doped light-emitting layer; and h) disposing a plurality of laterally spaced row electrodes over the electron-transporting layer to provide the array of pixels having the sets of three subpixel columns.

14. The method of making a full-color organic light-emitting display in accordance with claim 13 wherein forming the hole-transporting layer includes vapor depositing an organic hole-transporting material selected from the group consisting of aromatic tertiary amines.

15. The method of making a full-color organic light-emitting display in accordance with claim 13 wherein sequentially forming a dopant layer includes sequentially ink-jet printing the at least one first, second, and third dopants.

16. The method of making a full-color organic light-emitting display in accordance with claim 15 wherein the dopant layer ink-jet printing step includes the steps of:

a) formulating three ink-jet printable compositions each comprised of at least one printing fluid and at least one first, second, or third dopant;

b) filling each one of the printable compositions into a separate ink-jet printing cartridge;

c) aligning the corresponding subpixel column electrodes with respect to a printing direction; and d) sequentially printing each of the printable compositions over the hole-transporting layer and in a pattern which includes all subpixel columns designated for emitting one of red, green, and blue light.

17. The method of making a full-color organic light-emitting display in accordance with claim 16 wherein the step of formulating the ink-jet printable composition includes selecting at least one fluorescent dye as the at least one first, second, or third dopant.

18. The method of making a full-color organic light-emitting display in accordance with claim 17 wherein the fluorescent dye selecting step includes choosing a fluorescent dye selected from the class consisting of coumarin, dicyanomethylenepyrans and thiopyrans, polymethine, oxzbenzanthracene, xanthene, pyrylium and thiapyrylium, carbostyril, and perylene fluorescent dyes.

19. The method of making a full-color organic light-emitting display in accordance with claim 13 wherein the step of sequentially forming a dopant layer includes the steps of:

a) sequentially ink-jet printing on a donor support a dopant donor layer in a subpixel pattern of the at least one first, second, and third dopants;

b) positioning the subpixel pattern of dopant donor layers in close proximity to the hole-transporting layer and in alignment with respect to the subpixel column electrodes thereof; and c) transferring the dopants as a subpixel pattern from the dopant donor layers to the hole-transporting layer by heating the donor support.

20. The method of making a full-color organic light-emitting display in accordance with claim 13 wherein the light-emitting layer forming step includes vapor depositing an organic light-emitting host material selected from the group consisting of metal chelated oxinoid compounds.

21. The method of making a full-color organic light-emitting display in accordance with claim 13 wherein the step of diffusing the first, second, and third dopants together includes exposing the light-emitting layer and the dopant layers to vapor of a fluid or of a fluid mixture selected to provide molecular diffusion paths in the light-emitting layer which permit uniform diffusion of the dopants as patterns into the host material of the light-emitting layer.

22. The method of making a full-color organic light-emitting display in accordance with claim 13 wherein the electron-transporting layer forming step includes vapor depositing an organic electron-transporting material selected from the group consisting of metal chelated oxinoid compounds.

23. The method of making a full-color organic light-emitting display in accordance with claim 13 wherein the row electrode-disposing step includes vapor depositing row electrodes and of a material selected to provide electron injection from the row electrodes into the electron-transporting layer.

24. A method of making a full-color organic light-emitting display having an array of light-emitting pixels arranged in intersecting columns and rows with each column having a set of three subpixel columns designated for emitting one of red, green, and blue light respectively, the method comprising the steps of:
  a) providing a light transmissive and electrically insulative substrate;
  b) disposing a plurality of laterally spaced light transmissive subpixel column electrodes over the substrate;
  c) forming an organic hole-transporting layer over the subpixel column electrodes and over the substrate;
  d) forming an organic light-emitting layer over the hole-transporting layer and of a light-emitting host material selected to produce a host light emission in a blue spectral region;
  e) forming a dopant layer over the light-emitting layer in a pattern corresponding to each of the subpixel column electrodes of each set of subpixel columns and of at least one dopant selected to produce one of red, green, or spectrally modified blue light emission from the light-emitting layer;
  f) diffusing the at least one dopant from the dopant layer into the light-emitting layer to provide a selectively doped light-emitting layer;
  g) repeating the dopant layer forming and diffusing steps to produce each of two other colors of light emission from the selectively doped light-emitting layer;
  h) forming an organic electron-transporting layer over the doped light-emitting layer; and
  i) disposing a plurality of laterally spaced row electrodes over the electron-transporting layer to provide the array of pixels having the sets of three subpixel columns.

25. A method of making a full-color organic light-emitting display having an array of light-emitting pixels arranged in intersecting columns and rows with each column having a set of three subpixel columns designated for emitting one of red, green, and blue light respectively, the method comprising the steps of:
  a) providing a light transmissive and electrically insulative substrate;
  b) disposing a plurality of laterally spaced light transmissive subpixel column electrodes over the substrate;
  c) forming an organic hole-transporting layer over the subpixel column electrodes and over the substrate;
  d) forming an organic light-emitting layer over the hole-transporting layer and of a light-emitting host material selected to produce a host light emission in a blue spectral region;
  e) sequentially ink-jet printing a dopant layer over the light-emitting layer in a pattern corresponding to each of the subpixel column electrodes of each set of subpixel columns and of at least one first dopant selected to produce red light emission, at least one second dopant selected to produce green light emission, and at least one third dopant selected to produce spectrally modified blue light emission from the light-emitting layer;
  f) diffusing the first, second, and third dopants together from the respective dopant layers into the light-emitting layer to provide a selectively doped light-emitting layer;
  g) forming an organic electron-transporting layer over the doped light-emitting layer; and
  h) disposing a plurality of laterally spaced row electrodes over the electron-transporting layer to provide the array of pixels having the sets of three subpixel columns.

26. The method of making a full-color organic light-emitting display in accordance with claim 25 wherein forming the hole-transporting layer includes vapor depositing an organic hole-transporting material selected from the group consisting of aromatic tertiary amines.

27. The method of making a full-color organic light-emitting display in accordance with claim 25 wherein forming the light-emitting layer includes vapor depositing an organic light-emitting host material selected from the group consisting of metal chelated oxinoid compounds.

28. The method of making a full-color organic light-emitting display in accordance with claim 25 wherein forming the light-emitting layer includes solution coating a polymeric organic light-emitting host material selected from the group consisting of polyparaphenylene vinylene (PPV), PPV copolymers, polyanilines, poly-3-alkylthiopenes, poly-3-octylthiopenes, and polyparaphenylenes.

29. The method of making a full-color organic light-emitting display in accordance with claim 25 wherein dopant layer ink-jet printing includes the steps of:
  a) formulating three ink-jet printable compositions each comprised of at least one printing fluid and at least one first, second, or third dopant;
  b) filling each one of the printable compositions into a separate ink-jet printing cartridge;
  c) aligning the corresponding subpixel column electrodes with respect to a printing direction; and
  d) sequentially printing each of the printable compositions over the light-emitting layer and in a pattern which includes all subpixel columns designated for emitting one of red, green, and blue light.

30. The method of making a full-color organic light-emitting display in accordance with claim 29 wherein the step of formulating the ink-jet printable composition includes selecting at least one fluorescent dye as the at least one first, second, or third dopant.

31. The method of making a full-color organic light-emitting display in accordance with claim 30 wherein selecting the fluorescent dye includes choosing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

32. The method of making a full-color organic light-emitting display in accordance with claim 25 wherein the step of diffusing the first, second, and third dopants together includes exposing the dopant layers and the light-emitting layer to vapor of a fluid or of a fluid mixture selected to provide molecular diffusion paths in the light-emitting layer which permit uniform diffusion of the dopants as patterns into the host material of the light-emitting layer.

33. The method of making a full-color organic light-emitting display in accordance with claim 25 wherein forming the electron-transporting layer includes vapor depositing an organic electron-transporting material selected from the group consisting of metal chelated oxinoid compounds.

34. The method of making a full-color organic light-emitting display in accordance with claim 25 wherein the row electrode-disposing step includes vapor depositing row electrodes and of a material selected to provide electron injection from the row electrodes into the electron-transporting layer.

35. A method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a light transmissive and electrically insulative substrate;

b) disposing a plurality of laterally spaced light transmissive subpixel column electrodes over the substrate;

c) forming an organic hole-transporting layer over the subpixel column electrodes and over the substrate;

d) forming an organic light-emitting layer over the hole-transporting layer and of a light-emitting host material selected to produce a host light emission in a blue spectral region;

e) ink-jet printing at least one first fluorescent dopant over the light-emitting layer in a pattern corresponding to each of the subpixel column electrodes of each set of subpixel columns and selected to produce red light emission, and diffusing the at least one first dopant into the light-emitting layer during the ink-jet printing step to provide a light-emitting layer which is selectively doped to emit red light;

f) repeating the ink-jet printing and diffusing steps for each of at least one second fluorescent dopant selected to produce green light emission and at least one third fluorescent dopant selected to produce blue light emission from respectively corresponding subpixels to provide a light-emitting layer which is selectively doped to emit red, green, or blue light;

g) forming an organic electron-transporting layer over the doped light-emitting layer; and h) disposing a plurality of laterally spaced row electrodes over the electron-transporting layer to provide the array of pixels having the sets of three subpixel columns.

36. A method of making a full-color organic light-emitting display having an array of light-emitting pixels arranged in intersecting columns and rows with each column having a set of three subpixel columns designated for emitting one of red, green, and blue light respectively, the method comprising the steps of:

a) providing a light transmissive and electrically insulative substrate;

b) disposing a plurality of laterally spaced light transmissive subpixel column electrodes over the substrate;

c) forming an organic hole-transporting layer over the subpixel column electrodes and over the substrate;

d) forming an organic light-emitting layer over the hole-transporting layer and of a light-emitting host material selected to produce a host light emission in a blue spectral region;

e) sequentially forming a dopant layer over the light-emitting layer in a pattern corresponding to each of the subpixel column electrodes of each set of subpixel columns and of at least one first dopant selected to produce red light emission, at least one second dopant selected to produce green light emission, and at least one third dopant selected to produce spectrally modified blue light emission from the light-emitting layer;

f) diffusing the first, second, and third dopants together from the respective dopant layers into the light-emitting layer to provide a selectively doped light-emitting layer;

g) forming an organic electron-transporting layer over the doped light-emitting layer; and h) disposing a plurality of laterally spaced row electrodes over the electron-transporting layer to provide the array of pixels having the sets of three subpixel columns.

37. The method of making a full-color organic light-emitting display in accordance with claim 36 wherein the hole-transporting layer forming step includes vapor depositing an organic hole-transporting material selected from the group consisting of aromatic tertiary amines.

38. The method of making a full-color organic light-emitting display in accordance with claim 36 wherein the light-emitting layer forming step includes vapor depositing an organic light-emitting host material selected from the group consisting of metal chelated oxinoid compounds.

39. The method of making a full-color organic light-emitting display in accordance with claim 36 wherein the light-emitting layer forming step includes solution coating a polymeric organic light-emitting host material selected from the group consisting of polyparaphenylene vinylene (PPV), PPV copolymers, polyanilines, poly-3-alkylthiopenes, poly-3-octylthiopenes, and polyparaphenylenes.

40. The method of making a full-color organic light-emitting display in accordance with claim 36 wherein the step of sequentially forming a dopant layer includes sequentially ink-jet printing the at least one first, second, and third dopants.

41. The method of making a full-color organic light-emitting display in accordance with claim 40 wherein the dopant layer ink-jet printing step includes the steps of:

a) formulating three ink-jet printable compositions each comprised of at least one printing fluid and at least one first, second, or third dopant;

b) filling each one of printable compositions into a separate ink-jet printing cartridge;

c) aligning the corresponding subpixel column electrodes with respect to a printing direction; and d) sequentially printing each of the printable compositions over the light-emitting layer and in a pattern which includes all subpixel columns electrodes designated for emitting one of red, green, and blue light.

42. The method of making a full-color organic light-emitting display in accordance with claim 41 wherein the step of formulating the ink-jet printable composition includes selecting at least one fluorescent dye as the at least one first, second, or third dopant.

43. The method of making a full-color organic light-emitting display in accordance with claim 42 wherein selecting the fluorescent dye includes choosing a fluorescent dye selected from the class consisting of coumarin, dicyanomethylenepyrans and thiopyrans, polymethine, oxabenzanthracene, xanthene, pyrylium and thiapyrylium, carbostyril, and perylene fluorescent dyes.

44. The method of making a full-color organic light-emitting display in accordance with claim 36 wherein sequentially forming a dopant layer includes the steps of:

a) sequentially ink-jet printing on a donor support a dopant donor layer in a subpixel pattern of the at least one first, second, and third dopants;

b) positioning the subpixel pattern of the dopant donor layers in close proximity to the light-emitting layer and in alignment with respect to the subpixel column electrodes thereof; and c) transferring the dopant as a subpixel pattern from the dopant donor layer to the light-emitting layer by heating the donor support.

45. The method of making a full-color organic light-emitting display in accordance with claim 36 wherein diffusing the first, second, and third dopants together includes exposing the dopant layers and the light-emitting layer to vapor of a fluid or of a fluid mixture selected to provide molecular diffusion paths in the light-emitting layer which permit uniform diffusion of the dopant as patterns into the light-emitting material of the light-emitting layer.

46. The method of making a full-color organic light-emitting display in accordance with claim 36 wherein forming the electron-transporting layer includes vapor depositing an organic electron-transporting material selected from the group consisting of metal chelated oxinoid compounds.

47. The method of making a full-color organic light-emitting display in accordance with claim 36 wherein the row electrode-disposing step includes vapor depositing row electrodes and of a material selected to provide electron injection from the row electrodes into the electron-transporting layer.

* * * * *